US006968300B2

(12) United States Patent
Wallace, Jr.

(10) Patent No.: US 6,968,300 B2
(45) Date of Patent: Nov. 22, 2005

(54) COMPUTER SYSTEM AND PRINTED CIRCUIT BOARD MANUFACTURED IN ACCORDANCE WITH A QUASI-MONTE CARLO SIMULATION TECHNIQUE FOR MULTI-DIMENSIONAL SPACES

(75) Inventor: Douglas Elmer Wallace, Jr., Austin, TX (US)

(73) Assignee: Dell Products L.P., Round Rock, TX (US)

( * ) Notice: Subject to any disclaimer, the term of this patent is extended or adjusted under 35 U.S.C. 154(b) by 725 days.

(21) Appl. No.: 09/771,049

(22) Filed: Jan. 26, 2001

(65) Prior Publication Data

US 2002/0103555 A1 Aug. 1, 2002

(51) Int. Cl.⁷ .......................... G06F 17/10; G06F 7/60; G06F 7/48

(52) U.S. Cl. .................... 703/2; 703/6; 703/13; 716/15

(58) Field of Search .................... 703/2, 6, 13; 705/36; 711/5; 716/15

(56) References Cited

U.S. PATENT DOCUMENTS

| | | | |
|---|---|---|---|
| 5,301,118 A | | 4/1994 | Heck et al. |
| 5,955,704 A | | 9/1999 | Jones et al. |
| 5,966,312 A | | 10/1999 | Chen |
| 6,058,377 A | * | 5/2000 | Traub et al. .................. 705/36 |
| 6,381,669 B1 | * | 4/2002 | Chudnovsky et al. .......... 711/5 |
| 6,539,531 B2 | * | 3/2003 | Miller et al. .................. 716/15 |

OTHER PUBLICATIONS

"Some Linear and Nonlinear Methods for Pseudorandom Number Generation", by Harald Niederreiter, Proceedings of the 1995 Winter Simulation Conference, pp. 250 to 254.*

* cited by examiner

Primary Examiner—W. Thomson
Assistant Examiner—Dwin Craig
(74) Attorney, Agent, or Firm—Haynes and Boone, LLP

(57) ABSTRACT

A computer system includes a printed circuit board manufactured in accordance with simulated trace impedances and topologies. The printed circuit board includes trace impedances characterizing at least three dimensions of a multi-dimensional space of the printed circuit board. The printed circuit board design includes trace impedances and topologies obtained with the use of a quasi-Monte Carlo simulation methodology.

8 Claims, 5 Drawing Sheets

Errors vs. simulation point number (note error of QMC method at 80 simulation points is approximately equal to 320 simulation points using the MC method)

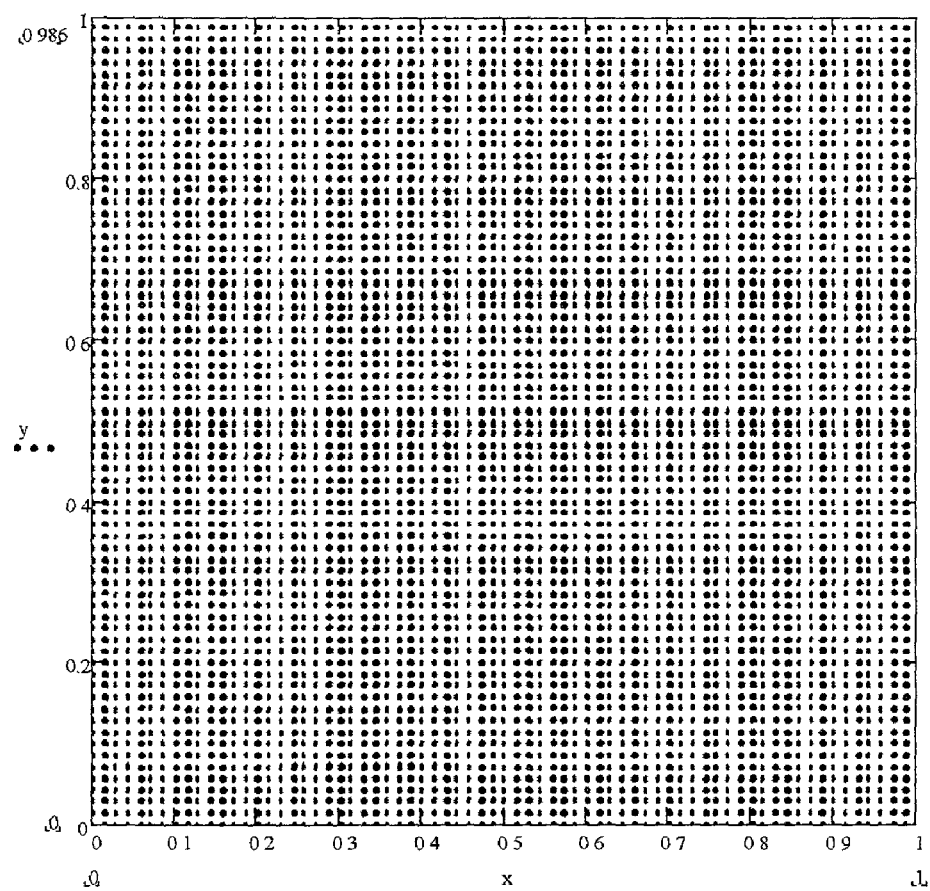
Figure 1 – Grid Pattern

Figure 2. – Monte Carlo (shows clumping and voiding)
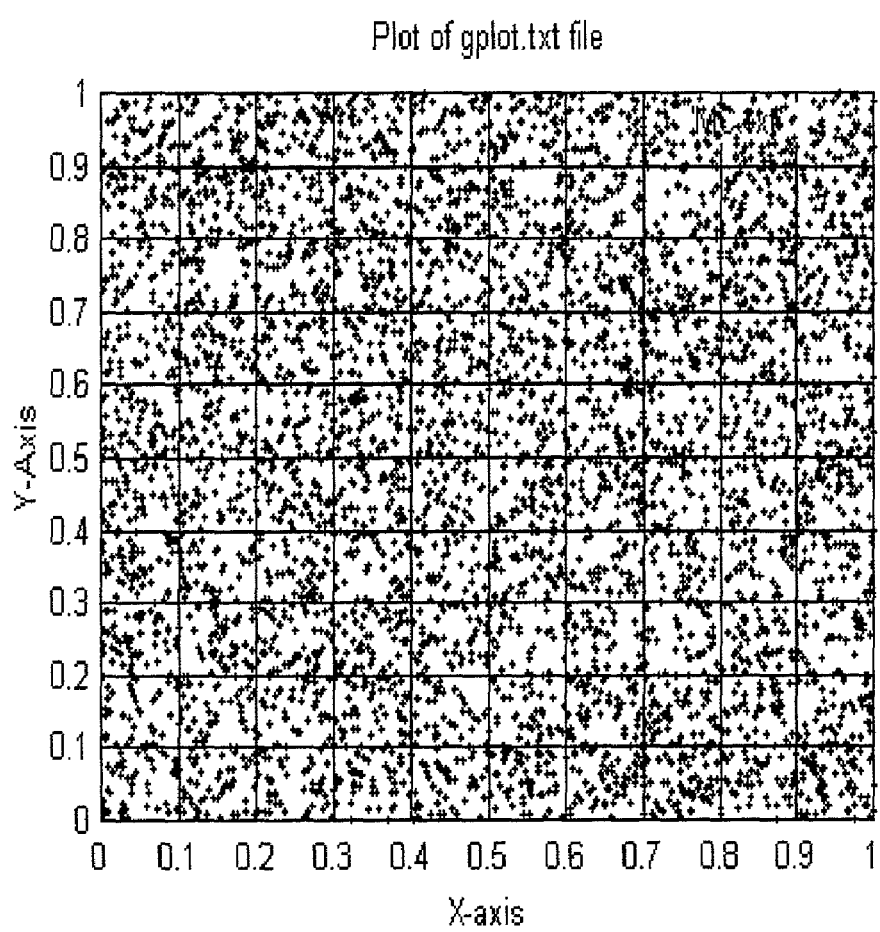

Figure 3. – Quasi-Monte Carlo with mapping
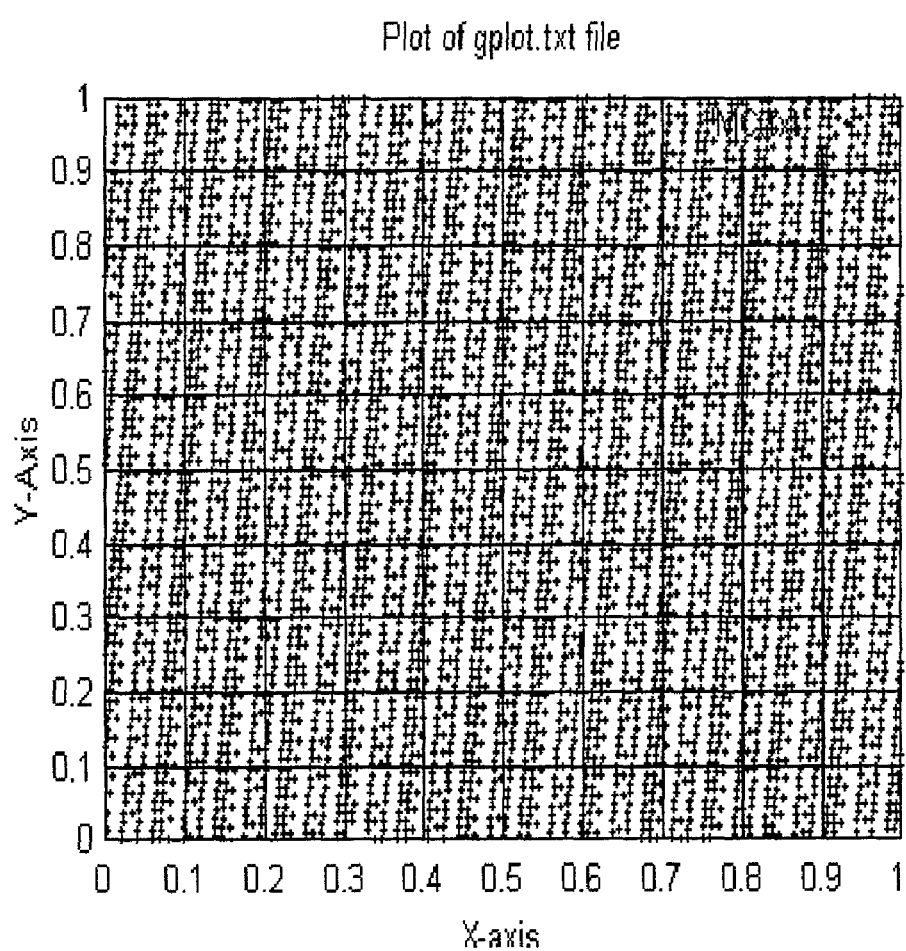

Figure 4. – Errors vs. simulation point number (note error of QMC method at 80 simulation points is approximately equal to 320 simulation points using the MC method)
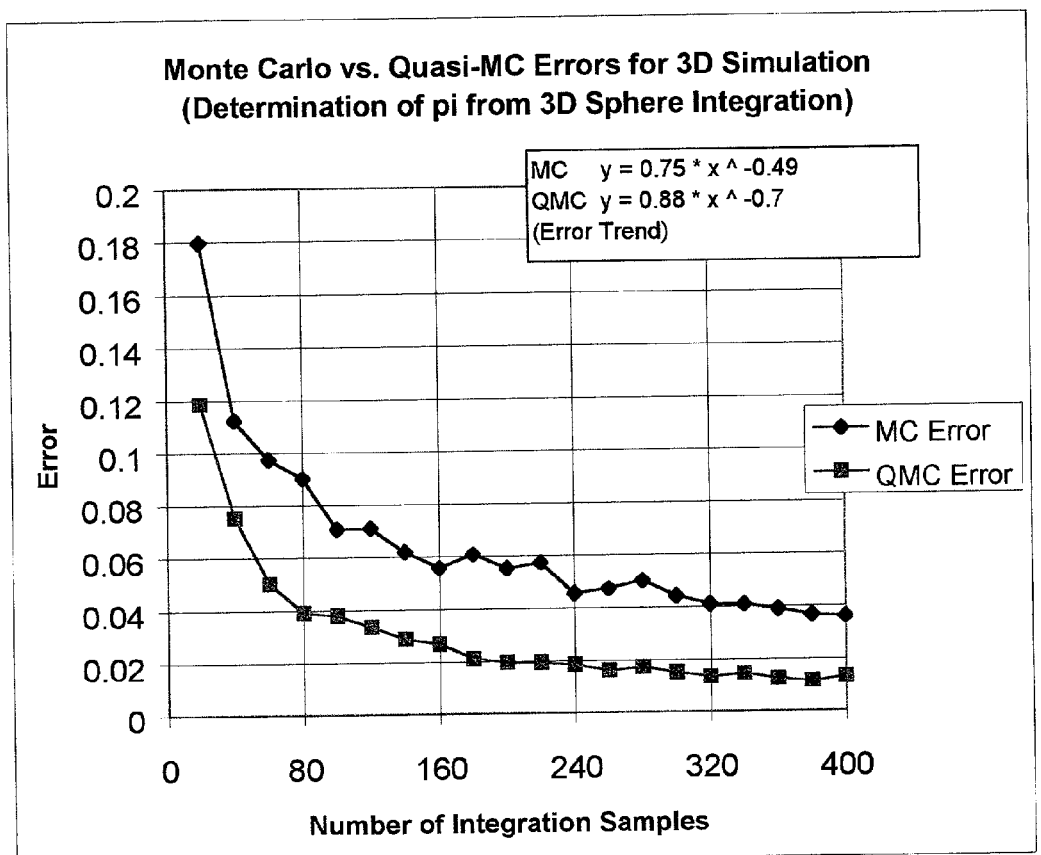

Figure 5. – Computer System Block Diagram
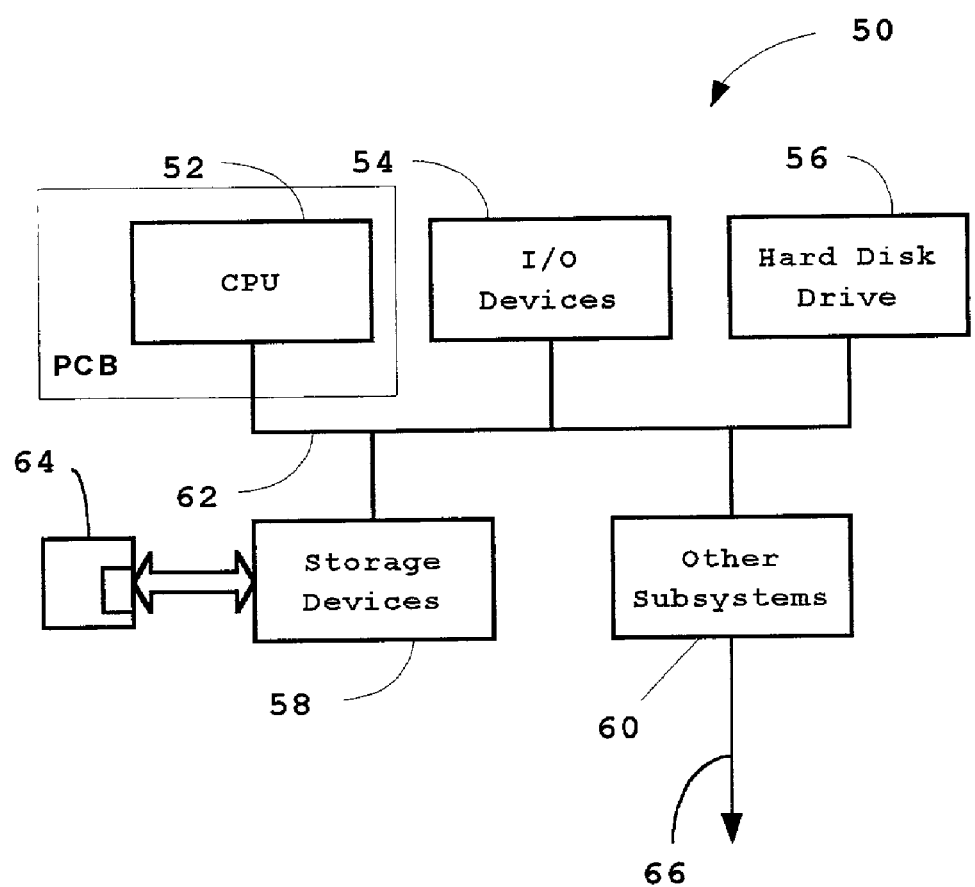

COMPUTER SYSTEM AND PRINTED CIRCUIT BOARD MANUFACTURED IN ACCORDANCE WITH A QUASI-MONTE CARLO SIMULATION TECHNIQUE FOR MULTI-DIMENSIONAL SPACES

BACKGROUND

The disclosures herein relate generally to computer systems and more particularly to printed circuit boards for computer systems manufactured with a quasi-Monte Carlo simulation technique for multi-dimensional spaces.

Simulation of multi-dimensional systems is becoming more necessary because of narrower constraints in modern designs. For example, determination of a printed-circuit board's trace impedance usually requires 3 or more dimensions (or parameters), trace width, dielectric height, dielectric constant, trace height, etc. Additional dimensions, such as solder mask thickness and permittivity constant, previously ignored because of their minimal effect in the days of wide constraints, now need to be considered. Each of these dimensions has manufacturing tolerances that affect the error of the impedance.

Simulation methods to determine the range of error on the final solution are needed to answer questions of which parameters are important to monitor or specify, and those parameters that are not. Undue lengthy simulation times pose problems in a manufacturing environment. As the number of dimensions increases, the number of simulation combinations grow geometrically, and can reach astronomical limits if high resolution is required. Accordingly, a need exists to efficiently determine this information within a reasonable simulation time.

In addition, signal integrity simulation may involve complex wiring topologies with multiple trace segments. For example, the combinations of ten (10) trace segments each with ten (10) possible lengths amounts to ten (10) billion possible topologies. It is unwise to methodically simulate every possible combination.

One prior method used is the grid method, briefly mentioned above. With the grid method, each dimension is defined to have a minimum and a maximum value, in addition to having a fixed number of evenly-spaced values in between. If there are ten dimensions that need to be resolved each into 10 points, then the simulation space is $10^{10}$, or 10 billion simulations. Not withstanding the extreme number of combinations, there are areas between the grid points that will never be simulated, which may miss some non-linear anomaly (such as resonance phenomena). FIG. 1 illustrates a graphical view of 5000 grid method points on a 1×1 grid.

A common stochastic method is the classic Monte Carlo technique, where a value for each dimension is randomly picked for each simulation. The Monte Carlo technique allows a smaller sample of values than the grid method, and can be set to obtain off-grid values. However, because of 'random clumping' (see FIG. 2), some areas will be redundantly sampled, while others may be ignored due to voids. The Monte Carlo method's error decreases inversely proportional to the square root of the number of samples, and doubling the sampling rate decreases the error by approximately 30%. FIG. 2 illustrates a 2D plot of 5000 Monte Carlo points on a 1×1 grid. Using the Monte Carlo method, undesirable clumping and voiding occur within the grid.

In addition to the Monte Carlo method, there exists a quasi-Monte Carlo method. The quasi-Monte Carlo method is a relatively new method (ca. 1992) that generates a hard-coded point-cloud that substantially evenly covers the dimensional space. The quasi-Monte Carlo method error drops at almost the rate of 1/N for multiple dimensions, wherein doubling the samples halves the error. This is very important in limiting the computations for medium to large dimensions.

A problem with quasi-Monte Carlo method, however, is that a sequence of generated numbers from one base cannot be indexed into the dimensional space without producing very non-random correlations. One accepted technique is to use multiple bases to generate separate quasi-Monte Carlo sequences for each dimension. Base numbers of 2, 3, and 5 are most often used for 3-dimensional work. The problem is that as the base gets larger, the point cloud becomes more sparse.

Accordingly, a need exists for a simulation method to determine a range of error to identify which parameters are important to monitor within a reasonable simulation time.

SUMMARY

According to one embodiment, a computer system is disclosed that includes a printed circuit board manufactured in accordance with simulated trace impedances and topologies. The printed circuit board includes trace impedances characterizing at least three dimensions of a multi-dimensional space of the printed circuit board. The printed circuit board design includes trace impedances and topologies obtained with the use of a quasi-Monte Carlo simulation methodology.

A technical advantage of the embodiments of the present disclosure is an improved efficiency in the simulation and coverage of multi-dimensional spaces, such as in simulating trace impedances in printed circuit board manufacturing.

BRIEF DESCRIPTION OF THE DRAWINGS

FIG. 1 illustrates a graphical view of 5000 grid method points on a 1×1 grid.

FIG. 2 illustrates a graphical view of 5000 Monte Carlo points on a 1×1 grid.

FIG. 3 illustrates a graphical view of 5000 quasi-Monte Carlo points on a 1×1 grid according to an embodiment of the present disclosure.

FIG. 4 illustrates a plot view comparison of Monte Carlo vs. quasi-Monte Carlo errors for a 3-D simulation.

FIG. 5 illustrates a block diagram view of a computer system having a printed circuit board manufactured according to the embodiments of the present disclosure.

DETAILED DESCRIPTION

According to the present embodiments, the method and system apparatus handle signal integrity simulations with stochastic techniques, further as discussed herein.

Further according to an embodiment of the present disclosure, the technique uses one base, 2, and maps the sequence into as many dimensions as desired for a given simulation of a multidimensional system application.

According to the present embodiments, a quasi-Monte Carlo number generator produces a sequence of numbers. Each number is mapped into N dimensions with a simple mapping function, providing N pseudo-random numbers from one. The technique produces very good coverage of the dimensional space, and can be used to sample a huge multi-dimensional problem, either for statistical purposes or to perform numerical integrations. Note that quasi-Monte Carlo is also referred to herein as "quasi-MC" or "QMC."

The present embodiments include the use of a quasi-MC generator algorithm, shown here in pseudo-code:

Begin QMC Generator (request for a floating point number between 0.0 and 1.0)
//previously generated QMC number is x, an 16-bit number in this case
x=x+1; //generate next QMC number in the sequence
R=x0/P+x1/P^2+x2/P^3+x3/P ^4 . . . x15/P^16;
//where xi is the ith bit in the number x, and P is the base value (usually 2)
return R //this is the pseudo-random number that the QMC generator returns, its value is between 0 and 1

End

This number, R, is then used to find the D dimension values (i.e., parameters).
//Assume D dimensions, each with a minimum and a maximum value, and each with
//S intervals. The first dimension, numbered D0, has these values defined as D0.min and
//D0.max, the second, D1.min and D1.max, etc.

The value of S has an impact on the accuracy of the final simulation value, as it defines a grid. Setting S to 1000 will produce a finely-meshed 3D grid of one billion points. The QMC generator then picks a subset of those points. The simulation done in the 3D sphere determination of π, (as discussed further herein with reference to FIG. 3), used S=1037.

Get Dvalue(i) //i is the index of the dimension value we wish to find, 0, 1, 2, . . . etc.
TC=(S+1)^D; //this is the Total Combinations of dimensional value points
Index=R*TC; //Index is a long integer value, less than TC (0<R<1)
num=1;
for(j=0; j<D−i−1; j++)
num=num*(S+1); //find sub combinations of other dimensions (long integer)
num1=Index/num; //divide Index value by sub-combinations (long integer)
Index2=num1% (S+1); //modulo division by S intervals to find (long integer)
D[i].delta=(D[i].max−D[i].min)/S; //delta is the value of each interval, (note not S+1)
D[i]=D[i].min+(double)lndex2*D[i].delta; //Index2 is a value between 0 and S, D[i] is scaled accordingly
return D[i]; //deliver the unique value of this dimension based on the Index Selection of the Value S S is the resolution of each dimension, and can be selected on that basis. However, according to the present embodiments, certain combinations are avoided, such that r, as defined below, is not factorable by either 2 (or other base, P) or D (the number of dimension).

$$r = s^D / P^N$$

According to one embodiment, the ratio, r, can be predetermined to be a prime number. For example, r can equal 37. Accordingly, a value for S can then be derived from the equation for r.

Referring now to FIG. 3, a quasi-Monte Carlo 5000 point cloud on the same 1×1 grid as in FIG. 2 is shown, wherein the point cloud of FIG. 3 was generated according to the method of the present disclosure. Note that while there exists some regularity in the quasi-Monte Carlo point cloud, there also exist a possibility for variables to occur outside the regularity of the point cloud.

3-D Sphere Simulation to Determine the Value of π

A test was conducted using both the Monte Carlo (MC) and the quasi-Monte Carlo methods on a 3 dimensional simulation problem. The test illustrates the superior error capability of the QMC method according to the present embodiments. The test simulation included the use of a sphere of 0.5 radius centered in a cube with sides of 1 unit. Sets of x, y, and z point-clouds were generated within the cube using the common Monte Carlo method and the quasi-MC method of the present disclosure. The ratio of points falling inside the sphere to the total number of points generated provided an estimate of the sphere's volume. In addition, the value of π is estimated from the volume. Since the real value of π is known, the error of the simulation can be determined.

FIG. 4 provides a graphical illustration of the errors of both the MC and QMC methods for various size point-clouds, from 20 to 400. The number of integration samples is equivalent to the size of a respective point cloud. The errors were determined (for each point-cloud size) by averaging 100 simulations.

For each simulation, error was determined according to the following:

Error=Absolute Value of (Vsim−Vact)/Vact, where Vsim represents a simulated value and Vact represents an actual value.

Trend line equations (i.e., fitting of respective data points to corresponding equations) for each of the MC and QMC data simulations were generated. The trend line equations, shown in FIG. 4, illustrate that the MC method has a classic $1/\sqrt{N}$ error decrease, (the exponent of x is approximately −0.5), whereas, the QMC error drops much faster. For instance, an average QMC simulation of 80 points is equivalently accurate to an MC simulation using 320 points. Accordingly, the QMC method of the present disclosure provides an advantage in reducing simulation time.

Accordingly, the present embodiments advantageously reduce the number of simulations in a multi-dimensional space and still provide a reasonable level of accuracy/completeness within a limited time frame.

The present embodiments are applicable for simulations in designs of trace impedances and topologies for electrical signal integrity of a circuit of a printed circuit board, such as a computer system motherboard. Exemplary parameters or variables may include trace width, dielectric height, relative strength of drivers, trace thickness, dielectric constants, series termination resistors, slew rate of devices (fast, slow, etc.), capacitances (large, small, etc.), multiple traces on the printed circuit board, topology, common segments, etc. The present embodiments are also applicable for use in mechanical designs or other designs involving simulations characterized as multi-dimensional or having many parameters.

The present embodiments provide a unique combination of quasi-Monte Carlo number generation and a prescribed mapping function. The prescribed mapping function maps the quasi-Monte Carlo random variables into a parameter space of the corresponding real world simulation.

According to one embodiment of the present disclosure, the mapping function provides a unique set of variables for each random number generated by the quasi-Monte Carlo number method as described herein.

The variable S helps determine how precise one desired the variable to be. The value of S is selected so that certain variables or combinations are avoided. That is, the value of S is selected to avoid the occurrence of resonance or the remapping of random numbers to the same variable. With the Monte Carlo method, there can occur missed variables (i.e., voids or gaps in the variable space) or repeated variables (i.e., clumps), where multiple of the random numbers get mapped to the same variable.

With the grid method alone, if an important point (i.e., variable) is not on the grid, then that point gets overlooked. In addition, in certain cases, a random number may cause a resonance, however, the variable gets overlooked because of the grid method. With the grid method, achieving a higher resolution can only be accomplished by increasing the number of random numbers generated.

Referring briefly to FIG. 5, a system block diagram of a computer system 50 is shown having a printed circuit board PCB or other system element manufactured in accordance with the simulation method of the present disclosure. The computer system includes a central processing unit (CPU) 52, input/output (I/O) devices, such as a display, a keyboard, a mouse or other pointer device, and associated controllers, collectively designated by a reference numeral 54, a hard disk drive 56, and other storage devices, such as may include a floppy disk drive, CD-ROM drive, and the like, collectively designated by reference numeral 58, and various other subsystems, such as a network interface card, collectively designated by reference numeral 60, all interconnected via one or more buses, shown collectively as a bus 62. A computer readable media 64 (such as a floppy disk, CD-ROM, or the like) is also included. Computer system 50 may be coupled to a network via a suitable network or modem cable 66. One or more of the components of the computer system may be manufactured on a printed circuit board manufactured in accordance with the simulation of trace impedances and topologies of the present disclosure.

Although only a few exemplary embodiments have been described in detail above, those skilled in the art will readily appreciate that many modifications are possible in the exemplary embodiments without materially departing from the novel teachings and advantages described herein. Accordingly, all such modifications are intended to be included within the scope of the embodiments as defined in the following claims. In the claims, means-plus-function clauses are intended to cover the structures described herein as performing the recited function and not only structural equivalents, but also equivalent structures.

What is claimed:

1. A method for simulating trace impedance for application to manufacture a printed circuit board using a quasi-Monte Carlo model comprising:

generating a sequence of pseudo-random numbers according to a prescribed quasi-Monte Carlo model;

mapping each pseudo-random number R of the sequence of random numbers into multiple variables of unique values for the multi-dimensional space, the multi-dimensional space including D dimensions, where D is a number, the mapping providing a substantially even hard-coded point-cloud to define a grid of quasi-Monte Carlo points to provide some regularity in the point cloud over the multi-dimensional space; and selecting a value of S according to a desired accuracy of a final simulation value, wherein the value of S defines a grid for use in conjunction with the mapping of the pseudo-random numbers into the multiple variables of the multi-dimensional space, wherein each of the multiple variables of the multi-dimensional space represents a corresponding D dimension value and wherein each dimension is characterized by a minimum and a maximum value, further wherein each dimension is characterized by a prescribed resolution S, and wherein S is the resolution of each dimension, and a ratio r, as defined by $r=S^D/P^N$ can be predetermined to be a prime number so that the value for S can be derived from the equation for r, whereby, the simulation value in the multi-dimensional space is reduced to provide an increased accuracy within a reduced time, the simulation value being applicable for simulations of trace impedance in circuit board manufacture.

2. The method of claim 1, wherein the D dimension values are further characterized by a first dimension D0 that includes minimum and maximum values defined as D0.min and D0.max, respectively, a second dimension D1 that includes minimum and maximum values defined as D1.min and D1.max, etceteras, up to a Dth dimension.

3. A method for simulating trace impedance for application to a printed circuit board design using a quasi-Monte Carlo model comprising:

generating a sequence of pseudo-random numbers according to a prescribed quasi-Monte Carlo model;

mapping each pseudo-random number R of the sequence of random numbers into multiple variables of unique values for the multi-dimensional space, the multi-dimensional space including D dimensions, where D is a number, wherein each of the multiple variables of the multi-dimensional space represents a corresponding D dimension value and wherein each dimension is characterized by a minimum and a maximum value, the D dimension values further being characterized by a first dimension D0 that includes minimum and maximum values defined as D0.min and D0.max, respectively, a second dimension D1 that includes minimum and maximum values defined as D1.min and D1.max, etceteras, up to a Dth dimension, further wherein each dimension is characterized by a prescribed resolution S, the mapping providing a substantially even hard-coded point-cloud to define a grid of quasi-Monte Carlo points to provide some regularity in the point cloud over the multi-dimensional space; and selecting a value of S according to a desired accuracy of a final simulation value, wherein the value of S defines a grid for use in conjunction with the mapping of the pseudo-random numbers into the multiple variables of the multi-dimensional space, wherein S is the resolution of each dimension and a ratio r, as defined by $r=s^D/P^N$, can be determined to be a prime number so that the value for S can be derived from the equation for r, whereby, the simulation value in the multi-dimensional space is reduced to provide an increased accuracy within a reduced time, the simulation value being applicable for simulations of trace impedance in circuit board design.

4. A method for simulating trace impedance for application to a printed circuit board design using a quasi-Monte Carlo model, said method comprising:

generating a sequence of pseudo-random numbers according to a prescribed quasi-Monte Carlo model;

mapping each pseudo-random number R of the sequence of random numbers into multiple variables of unique values for the multi-dimensional space, the multi-dimensional space including D dimensions, where D is a number, the mapping providing a substantially even hard-coded point-cloud to define a grid of quasi-Monte Carlo points to provide some regularity in the point cloud over the multi-dimensional space; and selecting a value of S according to a desired accuracy of a final simulation value, wherein the value of S defines a grid for use in conjunction with the mapping of the pseudo-random numbers into the multiple variables of the multi-dimensional space, wherein each of the multiple variables of the multi-dimensional space represents a corresponding D dimension value and wherein each dimension is characterized by a minimum and a maximum value, further wherein each dimension is characterized by a prescribed resolution S, and wherein S is the resolution of each dimension, and a ratio r, as defined by $r=s^D/P^N$ can be predetermined to be a prime number so that the value for S can be derived from the equation for r, whereby, the simulation value in the multi-dimensional space is reduced to provide an increased accuracy within a reduced time, the simulation value being applicable for simulations of trace impedance in circuit board design.

5. The method of claim 4, wherein the D dimension values are further characterized by a first dimension D0 that includes minimum and maximum values defined as D0.min and D0.max, respectively, a second dimension D1 that includes minimum and maximum values defined as D1.min and D1.max, etceteras, up to a Dth dimension.

6. Apparatus for simulating trace impedance for application to a printed circuit board design using a quasi-Monte Carlo model, said apparatus comprising:

a random number generator for generating a sequence of pseudo-random numbers according to a prescribed quasi-Monte Carlo model;

a mapping processor for mapping each pseudo-random number R of the sequence of random numbers into multiple variables of unique values for the multi-dimensional space, the multi-dimensional space including D dimensions, where D is a number, wherein each of the multiple variables of the multi-dimensional space represents a corresponding D dimension value and wherein each dimension is characterized by a minimum and a maximum value, the D dimension values further being characterized by a first dimension D0 that includes minimum and maximum values defined as D0.min and D0.max, respectively, a second dimension D1 that includes minimum and maximum values defined as D1.min and D1.max, etceteras, up to a Dth dimension, further wherein each dimension is characterized by a prescribed resolution S, the mapping providing a substantially even hard-coded point-cloud to define a grid of quasi-Monte Carlo points to provide some regularity in the point cloud over the multi-dimensional space; and a value selector for selecting a value of S according to a desired accuracy of a final simulation value, wherein the value of S defines a grid for use in conjunction with the mapping of the pseudo-random numbers into the multiple variables of the multi-dimensional space, wherein S is the resolution of each dimension and a ratio r, as defined by $r=s^D/P^N$, can be determined to be a prime number so that the value for S can be derived from the equation for r, whereby, the simulation value in the multi-dimensional space is reduced to provide an increased accuracy within a reduced time, the simulation value being applicable for simulations of trace impedance in circuit board design.

7. A method of designing a printed circuit board by simulating trace impedance using a quasi-Monte Carlo model comprising:

characterizing the printed circuit board by at least three dimensions of a multi-dimensional space; and manufacturing the printed circuit board in accordance with a simulated trace impedance, the simulated trace impedance obtained by:

generating a sequence of pseudo-random numbers according to a prescribed quasi-Monte Carlo model;

mapping each pseudo-random number R of the sequence of random numbers into multiple variables of unique values for the multi-dimensional space, the multi-dimensional space including D dimensions, where D is a number, wherein each of the multiple variables of the multi-dimensional space represents a corresponding D dimension value and wherein each dimension is characterized by a minimum and a maximum value, the D dimension values further being characterized by a first dimension D0 that includes minimum and maximum values defined as D0.min and D0.max, respectively, a second dimension D1 that includes minimum and maximum values defined as D1.min and D1.max, etceteras, up to a Dth dimension, further wherein each dimension is characterized by a prescribed resolution S, the mapping providing a substantially even hard-coded point-cloud to define a grid of quasi-Monte Carlo points to provide some regularity in the point cloud over the multi-dimensional space; and selecting a value of S according to a desired accuracy of a final simulation value, wherein the value of S defines a grid for use in conjunction with the mapping of the pseudo-random numbers into the multiple variables of the multi-dimensional space, wherein S is the resolution of each dimension and a ratio r, as defined by $r=s^D/P^N$, can be determined to be a prime number so that the value for S can be derived from the equation for r, whereby, the simulation value in the multi-dimensional space is reduced to provide an increased accuracy within a reduced time, the simulation value being applicable for simulations of trace impedance in circuit board design.

8. A computer system, including a printed circuit board designed by simulating trace impedance using a quasi-Monte Carlo model comprising:

the printed circuit board including impedance traces that characterize at least three dimensions of a multi-dimensional space of said printed circuit board, wherein said impedance traces include trace impedances obtained by:

generating a sequence of pseudo-random numbers according to a prescribed quasi-Monte Carlo model;

mapping each pseudo-random number R of the sequence of random numbers into multiple variables of unique values for the multi-dimensional space, the multi-dimensional space including D dimensions, where D is a number, wherein each of the multiple variables of the multi-dimensional space represents a corresponding D dimension value and wherein each dimension is characterized by a minimum and a maximum value, the D dimension values further being characterized by a first dimension D0 that includes minimum and maximum values defined as D0.min and D0.max, respectively, a second dimension D1 that includes minimum and maximum values defined as D1.min and D1.max, etceteras, up to a Dth dimension, further wherein each dimension is characterized by a prescribed resolution S, the mapping providing a substantially even hard-coded point-cloud to define a grid of quasi-Monte Carlo points to provide some regularity in the point cloud over the multi-dimensional space; and selecting a value of S according to a desired accuracy of a final simulation value, wherein the value of S defines a grid for use in conjunction with the mapping of the pseudo-random numbers into the multiple variables of the multi-dimensional space, wherein S is the resolution of each dimension and a ratio r, as defined by $r=s^D/P^N$, can be determined to be a prime number so that the value for S can be derived from the equation for r, whereby, the simulation value in the multi-dimensional space is reduced to provide an increased accuracy within a reduced time, the simulation value being applicable for simulations of trace impedance in circuit board design.

* * * * *